US006822599B2

United States Patent
Yoshioka et al.

(10) Patent No.: US 6,822,599 B2
(45) Date of Patent: Nov. 23, 2004

(54) INTEGRATED CIRCUIT AND A/D CONVERSION CIRCUIT

(75) Inventors: Masato Yoshioka, Kawasaki (JP); Kunihiko Gotoh, Tama (JP); Hiroshi Yamazaki, Kawasaki (JP); Masahiro Kudo, Kawasaki (JP); Hiroyuki Nakamoto, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 10/731,114

(22) Filed: Dec. 10, 2003

(65) Prior Publication Data

US 2004/0113830 A1 Jun. 17, 2004

(30) Foreign Application Priority Data

Dec. 13, 2002 (JP) ........................................ 2002-362471

(51) Int. Cl.[7] .............................................. H03M 1/12
(52) U.S. Cl. ...................................... 341/155; 341/172
(58) Field of Search .............................. 341/155, 158, 341/172; 327/65, 335, 336

(56) References Cited

U.S. PATENT DOCUMENTS

| 4,803,382 A | * | 2/1989 | Tanimoto et al. ............. 327/77 |
| 5,241,270 A | * | 8/1993 | Ng .............................. 324/251 |
| 6,504,500 B1 | * | 1/2003 | Tsukamoto ................. 341/155 |
| 2003/0011406 A1 | * | 1/2003 | Choi et al. .................... 327/76 |

* cited by examiner

Primary Examiner—Peguy JeanPierre
(74) Attorney, Agent, or Firm—Swidler Berlin Shereff Friedman, LLP

(57) ABSTRACT

The integrated circuit comprises an interior division circuit to hold a first amount of charge corresponding to a weighted sum of a first analog voltage and a second analog voltage corresponding to a digital signal, an exterior division circuit to hold a second amount of charge corresponding to a difference between the first analog voltage and second analog voltage, and an amplifying circuit to generate a voltage not within the range between the first analog voltage and the second analog voltage by amplifying the voltage depending on the sum of the first amount of charge and the second amount of charge. The integrated circuit may provide a lower consumption and small area integrated circuit which can generate an exterior division voltage of higher accuracy.

19 Claims, 10 Drawing Sheets

FIG. 5

| Control Signals | | | | | Voltages Stored In The First Period | | | | Differential Output Voltages Of The Second Period |
|---|---|---|---|---|---|---|---|---|---|
| D4 | D3 | D2 | D1 | C1 | M1 zp | M1 zm | M2 zp | M2 zm | $V_{out}^+ - V_{out}^-$ |
| 0 | 0 | 0 | 0 | 1 | $4V_1^+$ | $4V_1^-$ | $V_1^+ + V_2^-$ | $V_1^- + V_2^+$ | $\dfrac{5 \cdot (V_1^+ - V_1^-) - (V_2^+ - V_2^-)}{4}$ |
| 0 | 0 | 0 | 1 | 1 | $3V_1^+ + V_2^+$ | $3V_1^- + V_2^-$ | $V_1^+ + V_2^-$ | $V_1^- + V_2^+$ | $\dfrac{4 \cdot (V_1^+ - V_1^-)}{4}$ |
| 0 | 0 | 1 | 1 | 1 | $2V_1^+ + 2V_2^+$ | $2V_1^- + 2V_2^-$ | $V_1^+ + V_2^-$ | $V_1^- + V_2^+$ | $\dfrac{3 \cdot (V_1^+ - V_1^-) + 1 \cdot (V_2^+ - V_2^-)}{4}$ |
| 0 | 1 | 1 | 1 | 1 | $V_1^+ + 3V_2^+$ | $V_1^- + 3V_2^-$ | $V_1^+ + V_2^-$ | $V_1^- + V_2^+$ | $\dfrac{2 \cdot (V_1^+ - V_1^-) + 2 \cdot (V_2^+ - V_2^-)}{4}$ |
| 1 | 1 | 1 | 1 | 1 | $4V_2^+$ | $4V_2^-$ | $V_1^+ + V_2^-$ | $V_1^- + V_2^+$ | $\dfrac{1 \cdot (V_1^+ - V_1^-) + 3 \cdot (V_2^+ - V_2^-)}{4}$ |

FIG. 7

| Control Signals | | | | | | | Voltages Stored In The First Period | | | | Differential Output Voltages Of The Second Period $V_{out}^+ - V_{out}^-$ |
|---|---|---|---|---|---|---|---|---|---|---|---|
| D4 | D3 | D2 | D1 | G1 | S1 | S2 | M1 zp | M1 zm | M2 zp | M2 zm | |
| 0 | 0 | 0 | 0 | 1 | 1 | 0 | $4V_1^+$ | $4V_1^-$ | $V_1^+ + V_2^-$ | $V_1^- + V_2^+$ | $\dfrac{5 \cdot (V_1^+ - V_1^-) - (V_2^+ - V_2^-)}{4}$ |
| 0 | 0 | 0 | 0 | 1 | 0 | 0 | $4V_1^+$ | $4V_1^-$ | $V_1^+ + V_2^-$ | $V_1^- + V_2^+$ | $\dfrac{4 \cdot (V_1^+ - V_1^-)}{4}$ |
| 0 | 0 | 1 | 0 | 1 | 0 | 0 | $3V_1^+ + V_2^+$ | $3V_1^- + V_2^-$ | $V_1^+ + V_2^-$ | $V_1^- + V_2^+$ | $\dfrac{3 \cdot (V_1^+ - V_1^-) + 1 \cdot (V_2^+ - V_2^-)}{4}$ |
| 0 | 0 | 1 | 1 | 1 | 0 | 0 | $2V_1^+ + 2V_2^+$ | $2V_1^- + 2V_2^-$ | $V_1^+ + V_2^-$ | $V_1^- + V_2^+$ | $\dfrac{2 \cdot (V_1^+ - V_1^-) + 2 \cdot (V_2^+ - V_2^-)}{4}$ |
| 0 | 1 | 1 | 1 | 1 | 0 | 0 | $V_1^+ + 3V_2^+$ | $V_1^- + 3V_2^-$ | $V_1^+ + V_2^-$ | $V_1^- + V_2^+$ | $\dfrac{1 \cdot (V_1^+ - V_1^-) + 3 \cdot (V_2^+ - V_2^-)}{4}$ |
| 1 | 1 | 1 | 1 | 1 | 0 | 0 | $4V_2^+$ | $4V_2^-$ | $V_1^+ + V_2^-$ | $V_1^- + V_2^+$ | $\dfrac{4 \cdot (V_2^+ - V_2^-)}{4}$ |
| 1 | 1 | 1 | 1 | 1 | 0 | 1 | $4V_2^+$ | $4V_2^-$ | $V_1^+ + V_2^-$ | $V_1^- + V_2^+$ | $\dfrac{-(V_1^+ - V_1^-) + 5 \cdot (V_2^+ - V_2^-)}{4}$ |

INTEGRATED CIRCUIT AND A/D CONVERSION CIRCUIT

CROSS-REFERENCE TO RELATED APPLICATIONS

This application is based upon and claims the benefit of priority from the prior Japanese Patent Application No. 2002-341096, filed on Nov. 25, 2002, the entire contents of which are incorporated herein by reference.

FIELD OF THE INVENTION

The present invention relates to a general integrated circuit, and more specifically to an integrated circuit and A/D converting circuit utilizing a switched capacitor circuit.

BACKGROUND OF THE INVENTION

The switched capacitor circuit is an element circuit which may be widely used in a highly accurate and low power consumption D/A converting circuit, A/D converting circuit and filter, or the like.

The prior art technology of the D/A converting circuit using the switched capacitor circuit is disclosed, for example, in Japanese Published Unexamined Patent Application No. 55121/1999. This circuit holds, in a first period, any current of $V_{r+}$ and $V_{r-}$ to i unit capacitors C depending on the digital signals $S_1$ to $S_i$ taking the value −1 or 1, and outputs, in a second period, the voltage of $V_r(S_i+S_{i-1}+ \ldots +S_1)/i$ ($V_r$ is the absolute value of $V_{r+}$ or $V_{r-}$.) Accordingly, an interior division voltage between $V_{r+}$ and $V_{r-}$ is generated.

Moreover, Japanese Published Unexamined Patent Application No. 152413/1994 discloses a circuit which divides voltage using two differential amplifiers and a resistance line, and also generates not only an interior division voltage for two analog voltages V1 and V2 but also an exterior division voltage for voltages V1 and V2 (voltage not within the range of the voltages V1 and V2).

In an A/D converting circuit (for example, complementary type) which generates an analog voltage for conversion of lower-digit bits using the result of a comparator corresponding to higher-digit bits, the selection range is generally given the redundancy to reduce the influence of determination error due to the offset of the comparator. In this circuit, it is desirable to realize the voltage within the redundancy range, namely the exterior division voltage with the simplified and low power consumption circuit structure.

SUMMARY OF THE INVENTION

The technology discussed above cannot generate an exterior division voltage. Other technologies can generate an exterior division voltage but is inferior in the viewpoint of the power consumption and circuit area because two amplifiers are required and connections are also complicated. Moreover, since the resistance value of the resistance element generally includes large a fluctuation, there is a problem in the accuracy of the divided voltage generated.

Considering the background described above, the present invention to provides a low power consumption integrated circuit of small area which can generate an exterior division voltage of higher accuracy.

The present invention provides an integrated circuit comprising an interior division circuit for holding a first amount of charges corresponding to the weighted sum of a first analog voltage and a second analog voltage depending on a digital signal, an exterior division circuit for holding a second amount of charges corresponding to difference between the first analog voltage and the second analog voltage, and an amplifying circuit for generating a voltage depending on the sum of the first amount of charges and the second amount of charges to form the voltage not within the range between the first analog voltage and the second analog voltage.

A further aspect of the present invention is that an exterior division voltage may be generated through the addition of a predetermined potential to an interior division voltage by holding, with the interior division circuit, the charges corresponding to the interior division voltage obtained by dividing the range between the first analog voltage and the second analog voltage, holding, with the exterior division circuit, the charges corresponding to the difference of the first analog voltage and the second analog voltage, and by generating the voltage obtained by combining these charges with an amplifier. Accordingly, the voltage may be divided by using a capacitance element with less fluctuation and the exterior division voltage may be generated based the simplified circuit structure. As a result, it is possible to provide a low power consumption integrated circuit of having a small area which can generate an exterior division voltage with higher accuracy.

In the integrated circuit described above, an exterior division voltage may be generated through addition of the predetermined potential to an interior division voltage by holding, with an interior division circuit, the charge corresponding to an interior division voltage obtained by dividing the range between the first analog voltage and the second analog voltage, holding, with an exterior division circuit, the charge corresponding to the difference between a first analog voltage and a second analog voltage and then amplifying a voltage obtained by coupling these charges with an amplifier. Therefore, it is possible to divide the voltage using a capacitance element having less fluctuation and to generate an exterior division voltage with the simplified circuit structure. Accordingly, a low power consumption and small area integrated circuit which can generate an exterior division voltage of higher accuracy may be included.

BRIEF DESCRIPTION OF THE DRAWINGS

FIG. 5 is a diagram illustrating the table for control signals supplied to the switched capacitor circuit, voltages stored in the first period depending on the control signals, and differential output voltages outputted in the second period based on the above voltages.

FIG. 7 is a diagram illustrating the table for control signals supplied to the switched capacitor circuit of FIG. 6, voltages stored in the first period depending on the control signals and differential output voltages outputted in the second period based on above voltages.

DETAILED DESCRIPTION OF THE PREFERRED EMBODIMENTS

The embodiments of the present invention will be described in detail with reference to the accompanying drawings.

Figure 1:
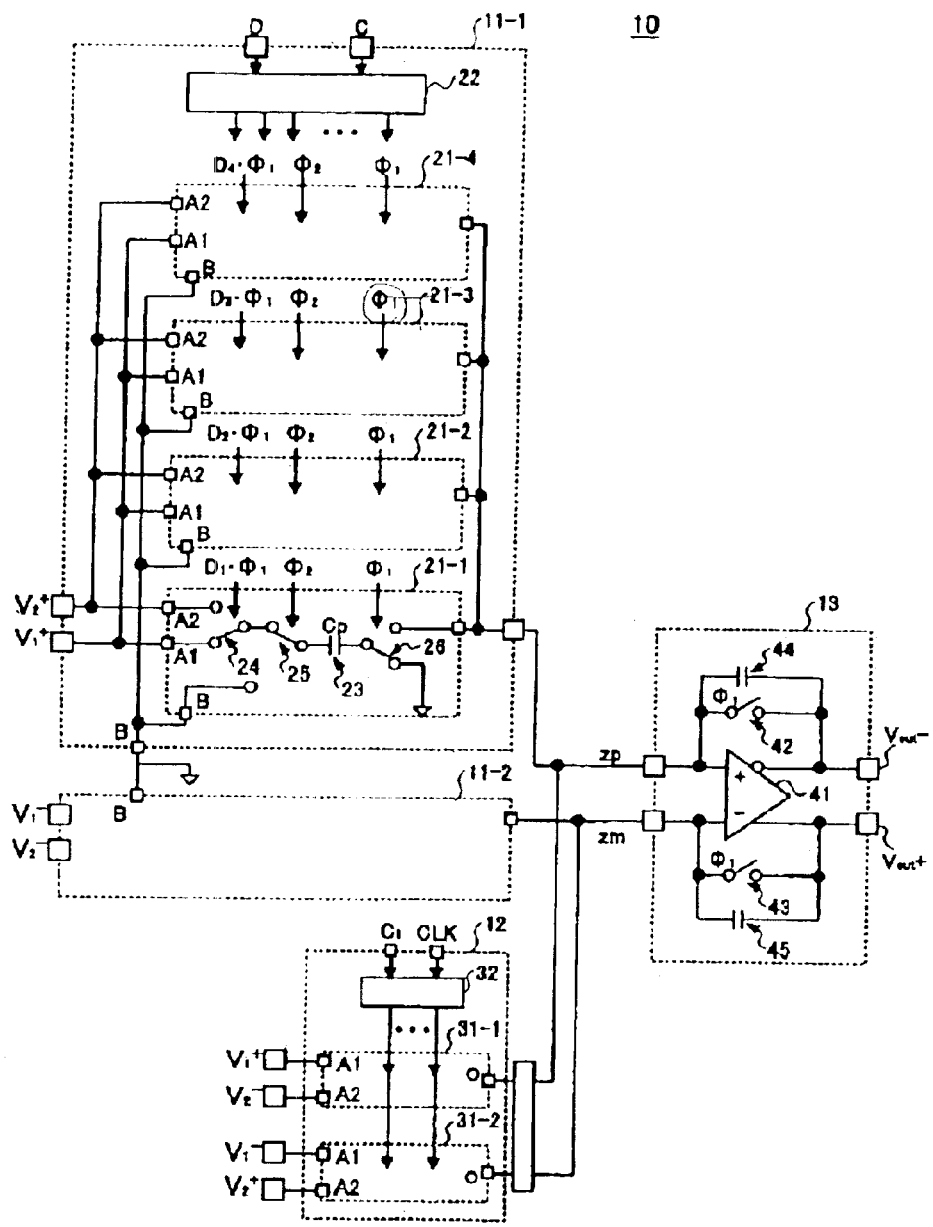
FIG. 1 is a diagram illustrating an exemplary embodiment of a switched capacitor circuit of the present invention.

FIG. 1 is a diagram showing one embodiment of a switched capacitor circuit according to the present invention. The switched capacitor circuit 10 of FIG. 1 includes a positive side interior division circuit 11-1, a negative side interior division circuit 11-2, an exterior division circuit 12, and an amplifying circuit 13. The positive interior division circuit 11-1 and the negative interior division circuit 11-2 have a substantially similar structure. In FIG. 1, the internal structure of the negative interior division circuit 11-2 is not shown. In this embodiment, the switched capacitor circuit 10 receives a first input voltage $V_1$ and a second input voltage $V_2$. $V_1$ is expressed with difference $V_1^+ - V_1^-$ of two differential signals, while $V_2$ is expressed with difference $V_2^+ - V_2^-$ of two differential signals. The positive interior division circuit 11-1 receives the positive signals $V_1^+$ and $V_2^+$, and holds the charges corresponding to the interior division voltage for the positive potential, while the negative interior division circuit 11-2 receives the negative signals $V_1^-$ and $V_2^-$ and holds the charges corresponding to the interior division voltage for the negative potential. One end of the capacitance element that holds charges is connected to the positive and negative inputs of the amplifying circuit 13 as the outputs of the positive interior division circuit 11-1 and negative interior division circuit 11-2.

The exterior division circuit 12 preferably receives voltages $V_1^+$, $V_1^-$, $V_2^+$, and $V_2^-$ and holds the charges to be added to an interior division voltage. One end of the capacitance element that holds charges is connected to the amplifying circuit 13 as an output. Accordingly, in the output of the amplifying circuit 13, a voltage generated by the exterior division circuit 12 is added to the interior division voltage existing in the range up to $V_2$ from $V_1$ generated by the positive interior division circuit 11-1 and negative interior division circuit 11-2, in order to generate the exterior division voltage not within the range up to $V_2$ from $V_1$.

The positive interior division circuit 11-1 (and negative interior division circuit 11-2) include capacitance circuits 21-1 to 21-4 and a control circuit 22. The capacitance circuits 21-1 to 21-4 have a substantially similar structure. In the positive interior division circuit 11-1, the capacitance circuits 21-1 to 21-4, respectively, receive positive signals $V_1^+$ and $V_2^+$. In the negative interior division circuit 11-2, the capacitance circuits 21-1 to 21-4, respectively, receive negative signals $V_1^-$ and $V_2^-$. The terminal B of the positive interior division circuit 11-1 and negative interior division circuit 11-2 is preferably connected to the predetermined fixed potential or opened.

In FIG. 1, four capacitance circuits 21-1 to 21-4 are used corresponding to the structure to generate an interior division voltage by dividing the voltage between the input voltages $V_1$ and $V_2$ into four voltages. Therefore, any number of capacitance circuits may be used as required. For example, when it is required to generate an internal division voltage by dividing the voltage between the input voltages $V_1$ and $V_2$ into eight voltages, about eight capacitance circuits may be used.

The capacitance circuit 21-1 includes a capacitor 23 and switches 24 to 26. The capacitance circuits 21-2 to 21-4 have a substantially similar structure. The capacitance value of the capacitor 23 is Cp. A control circuit 22 receives a digital signal D and a timing signal C from an external device and controls, based on the received signals, and the connection of the switches 24 to 26 in the capacitance circuits 21-1 to 21-4.

In the capacitance circuit 21-1, connection of the switch 24 is preferably determined with a value of the digital signal $D_1$. When $D_1$ is "1", the switch 24 is connected to the terminal A2 side and when $D_1$ is "0", the switch 24 is connected to the terminal A1 side. In the other capacitance circuits 21-2 to 21-4, connection of the switch 24 is preferably controlled with "1" or "0" of the digital signals $D_2$ to $D_4$.

Connection of the switch 25 is determined with a timing signal $\phi 2$. When the signal $\phi 2$ is low, the switch 25 is connected to the switch 24 side and when the signal $\phi 2$ is high, the switch 25 is connected to the terminal B side. Connection of the switch 26 is determined with a timing signal $\phi 1$. When the signal $\phi 1$ is high, the switch 26 is connected to the fixed voltage side and when the signal $\phi 1$ is low, the switch 26 is connected to the output terminal side (zp side of the amplifying circuit 13).

Figure 2:
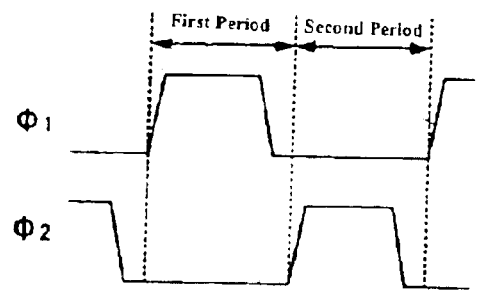
FIG. 2 is a diagram illustrating the timing relationship between the timing signals φ1 and φ2.

FIG. 2 illustrates the relationship of timing of the timing signals $\phi 1$ and $\phi 2$. As illustrated in this figure, the timing signals $\phi 1$ and $\phi 2$ are respectively high and low in the first period, and respectively low and high in the second period. When this timing relationship is considered from the viewpoint of the capacitance circuit 21-1 of FIG. 1, the switches 25 and 26 are connected in the connecting condition illustrated in FIG. 1 in the first period and are also connected to the terminals on the opposite side in the second period. Thereby, the charges accumulated in the capacitor 23 in the first period are connected to the output side (in the side of the amplifying circuit 13) in the second period. The amount of charges are different for each capacitance circuit 21-1 to 21-4, depending on the values of the digital signals $D_1$ to $D_4$.

Thereby, a potential outputted from the positive interior division circuit 11-1 becomes equal to the sum of addition of the weighted $V_1^+$ an $V_2^+$, depending on the number of signals of "1" among the digital signals D1 to D4, and more practically becomes equal to the interior division voltages obtained by dividing the voltage between $V_1^+$ and $V_2^+$ into four voltages. Namely, the output potential becomes $V_1^+$, $(3V_1^+ + V_2^+)/4$, $(2V_1+ + 2V_2+)/4$, $(V_1^+ + 3V_2^+)/4$, and $V_2^+$ depending on the number of signals of "1", 0, 1, 2, 3. Similarly, the potential outputted from the negative interior division voltage 11-2 becomes equal to the sum of the weighted $V_1^+$ and $V_2^+$ depending on the number of signal of "1" among the digital voltages $D_1$ to $D_4$, and more specifically becomes equal to the interior division voltages obtained by dividing the voltage between $V_1^-$ and $V_2^-$ into four voltages.

Referring to FIG. 1, the exterior division circuit 12 includes capacitance circuits 31-1 and 31-2 and a control circuit 32. The control circuit 32 receives the control signal C1 and clock signal CLK and controls the capacitance circuits 31-1 and 31-2 based on these signals. The capacitance circuits 31-1 and 31-2 have a substantially similar structure. The capacitance circuit 31-1 receives $V_1^+$ and $V_2^-$ as the input, while the capacitance circuit 31-2 receives $V_1^-$ and $V_2^+$ as the input. In both capacitance circuits 31-1, 31-2, these inputs are indicated as inputs A1 and A2.

Figure 3:
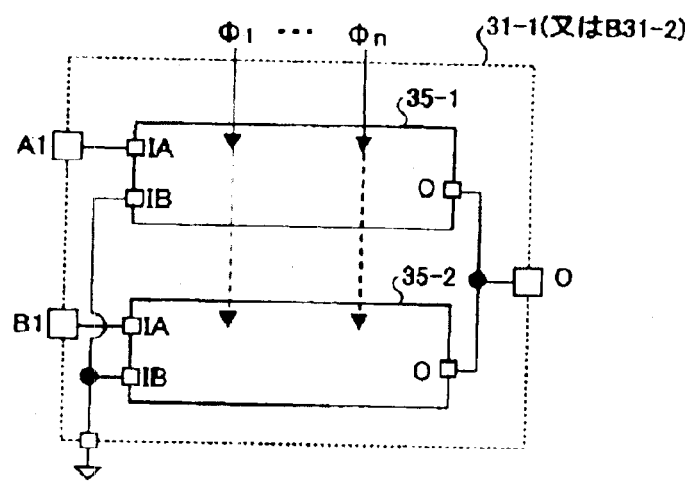
FIG. 3 is a diagram illustrating the structure of STET capacitance circuit.

FIG. 3 illustrates a structure of the capacitance circuit 31-1 (or 31-2). The capacitance circuit 31-1 preferably includes capacitance circuits 35-1 and 35-2. In one embodiment, the capacitance circuits 35-1 and 35-2 have a substantially similar structure. The capacitance circuit 35-1 receives, as an input, the input A1 described above and the predetermined fixed potential (or open), while the capacitance circuit 35-2 receives, as an input, the input A2 and the predetermined fixed potential (or open). In the capacitance circuits 35-1 and 35-2, these inputs are indicated as the inputs 1A and 1B.

Figure 4:
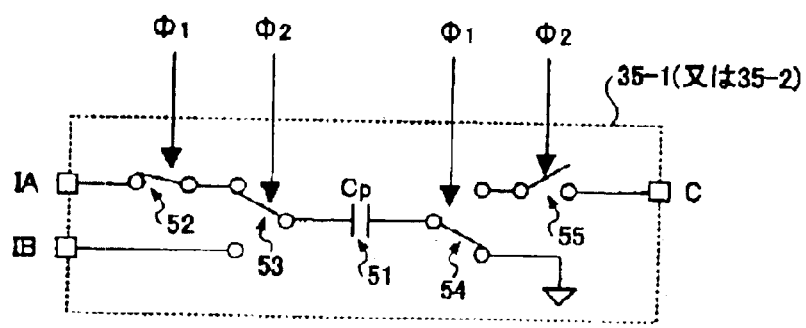
FIG. 4 is a diagram illustrating the structure of the capacitance circuit.

FIG. 4 illustrates an exemplary structure of the capacitance circuit 35-1 (or 35-2). The capacitance circuit 35-1 includes a capacitor 51 and switches 52 to 55. The capacitor 51 has a capacitance value Cp. Connection of the switches 52 to 55 may be controlled with the timing signals $\phi 1$ and $\phi 2$ supplied from the control circuit 32. These timing signals $\phi 1$ and $\phi 2$ are illustrated in FIG. 2 and these signals become High and Low in the first period and also become Low and High in the second period.

The connecting conditions of the switches 52 to 55 in FIG. 4 are indicated as the condition in the first period and the switches 53 and 54 are connected to the reverse side of the terminals of FIG. 4 in the second period and the switch 55 is closed to become conductive condition. The end of the capacitor 51 that accumulates charges in the first period is then connected to the output terminal O in the second period. The potentials for these charges are V1+ and V2− at the capacitance circuits 35-1 and 35-2 of the capacitance circuit 31-1, while these are, respectively, $V_1^-$ and $V_2^+$ at the capacitance circuits 35-1 and 35-2 of the capacitance circuit 31-2.

Therefore, the voltages $V_1^+$ and $V_2^-$ are preferably supplied to the zp input side of the amplifying circuit 13 from the exterior division circuit 12, while the voltages $V_1^-$ and $V_2^+$ to the zm input side from the exterior division circuit 12.

Referring to FIG. 1, the amplifying circuit 13 includes a differential amplifier 41, switches 42, 43 and capacitors 44, 45. In one embodiment, switches 42 and 43 are controlled with the timing signal $\phi 1$ to set the input and output of the differential amplifier to the equal potential through termination in the first period, and are then opened in the second period. In the second period, the gain of the differential amplifier 41 is set to the desired value depending on a ratio of the capacitances 44,45 and capacitance connected to the input side of the differential amplifier 41 (capacitances of the positive interior division circuit 11-1, negative interior division circuit 11-2 and exterior division circuit 12). Here, the capacitance values of capacitors 44 and 45 are set to the value equal to four times the capacitance value Cp used in the positive interior division circuit 11-1, negative interior division circuit 11-2 and exterior division circuit 12.

Owing to the structure described above, voltages illustrated in FIG. 5 appear at the output of the amplifying circuit 13. FIG. 5 is a table showing exemplary control signals supplied to the switched capacitor circuit 10, voltages stored in the first period depending on the control signal, and differential output voltages outputted in the second period based on such voltage.

The control signal $C_1$ indicates the exterior division process. When this control signal $C_1$ is "1", the exterior division circuit 12 operates to generate a voltage added to the interior division voltage to obtain an exterior division voltage. The potentials generated by the exterior division circuit 12 are indicated as M2 in the table shown in FIG. 5. The digital signals $D_1$ to $D_4$ designate the interior division voltage values generated by the positive interior division circuit 11-1 and negative interior division circuit 11-2. For example, when only $D_1$ is "1", the interior division voltage corresponding to $(3V_1+V_2)/4$ is generated. Moreover, when only $D_1$ and $D_2$ are "1", the interior division voltage corresponding to $(2V_1+2V_2)/4$ is generated. The voltage values corresponding to the charges held by the positive interior division circuit 11-1 and negative interior division circuit 11-2 are indicated as M1 in the table of FIG. 5.

The output of the amplifying circuit 13 becomes equal to the value obtained by subtracting a sum of M1(zm side) and M2 (zm side) from a sum of M1 (zp side) and M2 (zp side) in the table of FIG. 5, and then multiplying ¼ thereto.

As described above, the differential output voltages indicated in the right most column of FIG. 5 can be obtained depending on the control signal $C_1$ and digital signals $D_1$ to $D_4$. For instance, the output voltage indicated in the upper most column is $(5V_1-V_2)/4$ and it is equal to $V_1+(V_1-V_2)/4$. Therefore, the potential can be obtained, in which the voltage obtained by dividing the voltage between $V_1$ and $V_2$ with four is placed at the external side of $V_1$.

In the structure of FIG. 1, only one exterior division circuit 12 is illustrated but it is also possible to provide a plurality of exterior division circuits 12 to control the drive/non-drive of each exterior division circuit 12 with the control signals $C_n$ (n =1, 2, 3, . . . ). In the structure of FIG. 1 where only one exterior division circuit 12 is provided, only one exterior division voltage $(5V_1-V_2)/4$ can be generated as illustrated in the table shown in FIG. 5, but in the structure where a plurality of exterior division circuits 12 are provided, a plurality of exterior division voltages may be generated.

Figure 6:
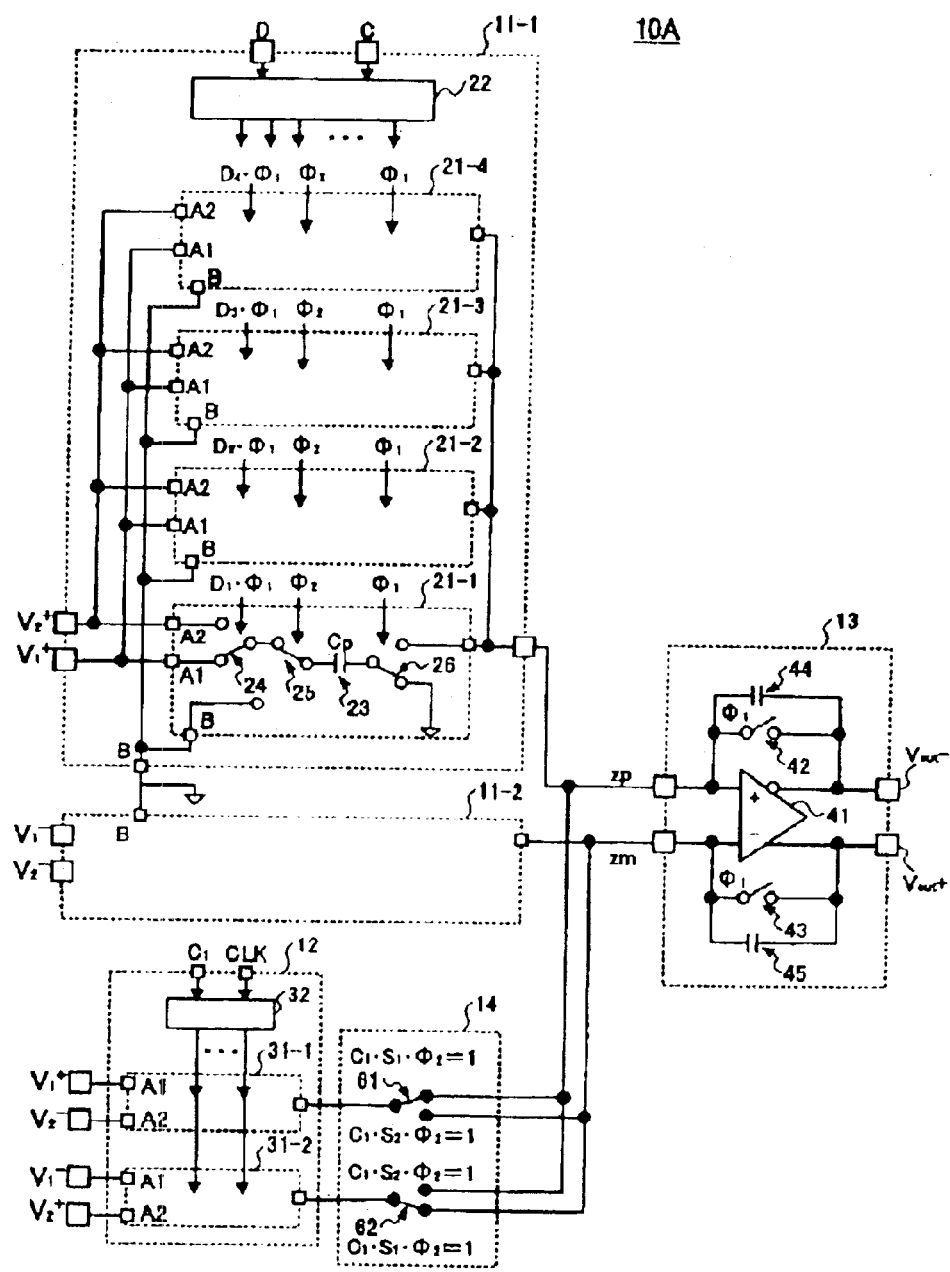
FIG. 6 is a diagram illustrating another example of the switched capacitor circuit shown in FIG. 1.

FIG. 6 shows another example of the switched capacitor circuit 10 illustrated in FIG. 1. In FIG. 6, the structural elements like those of FIG. 1 are designated with like reference numerals and description thereof are eliminated.

The switched capacitor circuit 10A shown FIG. 6 includes a selector circuit 14 that is added to the switched capacitor circuit 10 of FIG. 1. In one embodiment, the selector circuit 14 includes switches 61 and 62. The switch 61 is preferably connected to the upper side terminal (zp side) when $C_1 \cdot S_1 \cdot \phi 2$ is "1" and is also preferably connected to the lower side terminal (zm side) when $C_1 \cdot S_2 \cdot \phi 2$ is "1". The switch 62 is preferably connected to the lower side terminal (zm side) when $C_1 \cdot S_1 \cdot \phi 2$ is "1" and is preferably also connected to the upper side terminal (zp side) when $C_1 \cdot S_2 \cdot \phi 2$ is "1". When $C_1 \cdot S_1 \cdot \phi 2$ and $C_1 \cdot S_2 \cdot \phi 2$ are both "0", the switches 61 and 62 may not connected to any terminal.

FIG. 7 is a table indicating the control signals supplied to the switched capacitor circuit 10A, voltages stored in the first period depending on the control signals, and differential output voltages outputted in the second period based on the voltages.

As illustrated in the highest stage of the table of FIG. 7, when the switch control signal $S_1$ is set to "1", the exterior division voltage $V_1+(V_1-V_2)/4$ in the external side of $V_1$ can be generated. Moreover, as illustrated in the lowest stage of the table, when the switch control signal $S_2$ is set to "1", the exterior division voltage $V_2+(V_2-V_1)/4$ in the external side of $V_2$ can be generated. In addition, as illustrated in the $2^{nd}$ stage to the sixth stage of the Table, when the switch control signals $S_1$ and $S_2$ are set to "0", the interior division voltage obtained by dividing the voltage in the range between $V_1$ to $V_2$ into four voltages in the structure that the exterior division circuit 12 is separated from the amplifying circuit 13 and an output voltage of the exterior division circuit 12 may not added.

As described above, in the switched capacitor circuit 10A of FIG. 6, connection of the output of the exterior division circuit 12 can be controlled freely by providing a selector circuit 14. Accordingly, the operation to add an output voltage of the exterior division circuit 12 in the adding direction and the operation to add an output voltage of the exterior division circuit 12 in the subtracting direction may be selected and thereby the exterior division voltage can be obtained in both sides where the voltage is higher than the input voltage and the voltage is lower than the input voltage.

Figure 8:
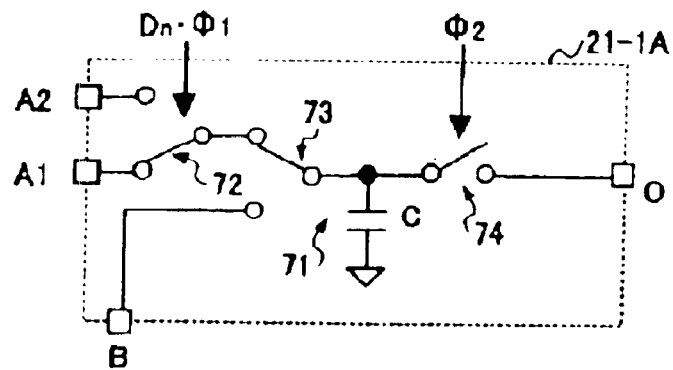
FIG. 8 is a diagram illustrating another embodiment of the capacitance circuit shown in FIG. 1.

FIG. 8 illustrates another embodiment of the capacitance circuit 21-1 of FIG. 1. The capacitance circuit 21-1A of FIG. 8 includes a capacitor 71 and switches 72 to 74. Like the capacitance circuit 21-1 of FIG. 1, connections of the switches 72 to 74 are controlled with the digital signal $D_n$ and timing signals $\phi1$ and $\phi2$. Accordingly, charges are accumulated to the capacitor 71 depending on the digital signal $D_n$ in the first period, while one end of the capacitor 71 holding such charges may be connected to the output terminal O in the second period.

Figure 9:
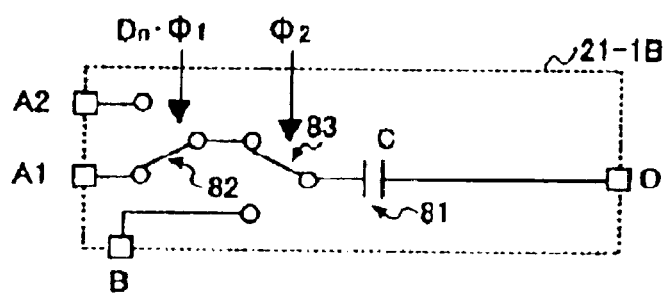
FIG. 9 is a diagram illustrating another embodiment of the capacitance circuit shown in FIG. 1.

FIG. 9 illustrates another embodiment of the capacitance circuit 21-1 of FIG. 1. The capacitance circuit 21-1 of FIG. 9 includes a capacitor 81 and switches 82 and 83. Like the capacitance circuit 21-1 of FIG. 1, connections of the switches 32 and 83 are controlled with the digital signal $D_n$ and timing signals $\phi1$ and $\phi2$. Accordingly, charges depending on the digital signal $D_n$ are accumulated in the capacitor 81 in the first period, while the potential corresponding to these charges is outputted to the output terminal O in the second period.

Figure 10:
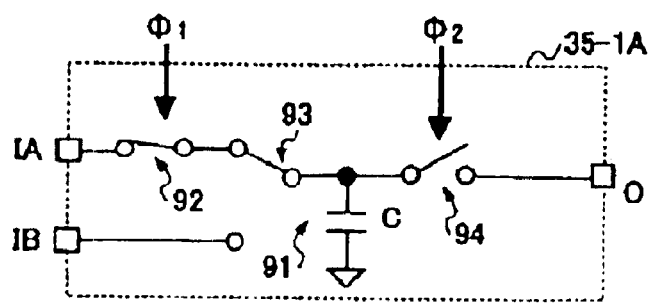
FIG. 10 is a diagram illustrating another embodiment of the capacitance circuit shown in FIG. 4.

FIG. 10 illustrates another embodiment of the capacitance circuit 35-1 of FIG. 4. The capacitance circuit 35-1A of FIG. 10 includes a capacitor 91 and switches 92 to 94. Like the capacitance circuit 35-1 of FIG. 4, connections of switches 92 to 94 are controlled with the timing signals $\phi1$ and $\phi2$. Accordingly, charges depending on the input 1A is accumulated in the capacitor 91 in the first period and the potential corresponding to these charges is outputted to the output terminal O in the second period.

Figure 11:
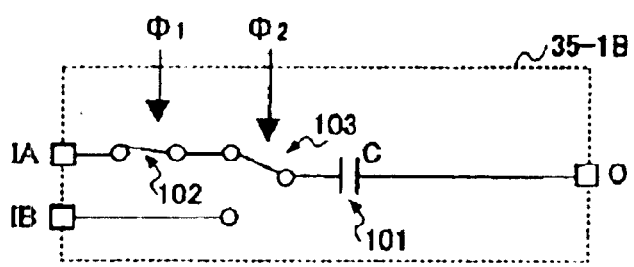
FIG. 11 is a diagram illustrating another embodiment of the capacitance circuit shown in FIG. 4.

FIG. 11 illustrates another embodiment of the capacitance circuit 35-1 of FIG. 4. The capacitance circuit 35-1B of FIG. 11 includes a capacitor 101 and switches 102 and 103. Like the capacitance circuit 35-1 of FIG. 4, connections of the switches 102 and 103 are controlled with the timing signals $\phi1$ and $\phi2$. Accordingly, charges depending on the input 1A is accumulated to the capacitor 101 in the first period of FIG. 2 and the potential corresponding to these charges is outputted to the output terminal 0 in the second period.

Figure 12:
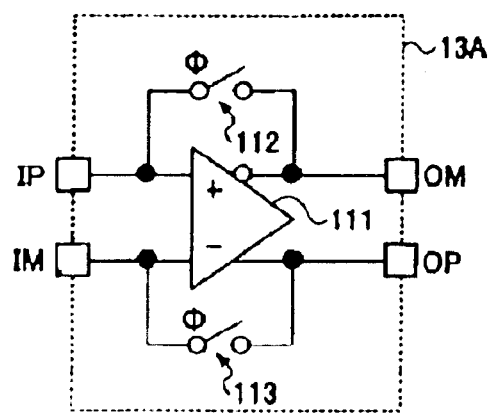
FIG. 12 is a diagram illustrating another embodiment of the amplifying circuit shown in FIG. 1.

FIG. 12 illustrates another embodiment of the amplifying circuit 13 of FIG. 1. The amplifying circuit 13A of FIG. 12 includes a differential amplifier 111 and switches 112 and 113. The switches 112 and 113 are preferably controlled with the timing signals $\phi1$ and $\phi2$. The switches 112 and 113 sets, in the first period of FIG. 2, the input and output of the differential amplifier 111 to the identical potential through the termination and are opened, in the second period, to enable the amplifying operation of the differential amplifier 111.

Figure 13:
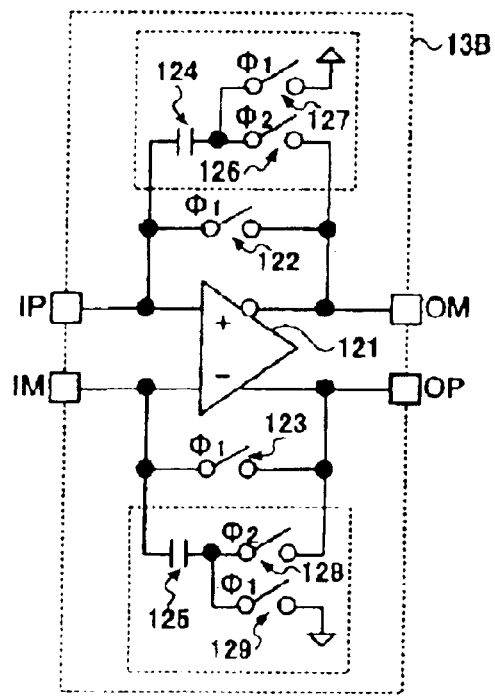
FIG. 13 is a diagram illustrating another embodiment of the amplifying circuit shown in FIG. 1.

FIG. 13 illustrates another embodiment of the amplifying circuit 13 of FIG. 1. The amplifying circuit 13B of FIG. 13 includes a differential amplifier 121, switches 122 and 123, capacitors 124 and 125 and switches 126 to 129. The switches 122 and 123 and switches 127 and 129 are controlled with the timing signal $\phi1$ and terminated in the first period and opened in the second period. When the switches 122 and 123 are terminated in the first period, the input/output of the differential amplifier 121 are terminated and are then set to the identical potential. Moreover, when the switches 127 and 129 are terminated in the first period, the input/output potentials in the terminated condition of the differential amplifier 121 are accumulated in the capacitors 124 and 125. Accordingly, offset of the differential amplifier 121 may be held in the capacitors 124 and 125 as a voltage difference.

When the switches 122, 123, 127 and 129 are opened and the switches 126 and 128 are terminated in the second period, the offset of the differential amplifier 121 can be cancelled with the potential held by the capacitors 124 and 125. Thereby, more accurate differential amplifying operation can be realized.

Figure 14:
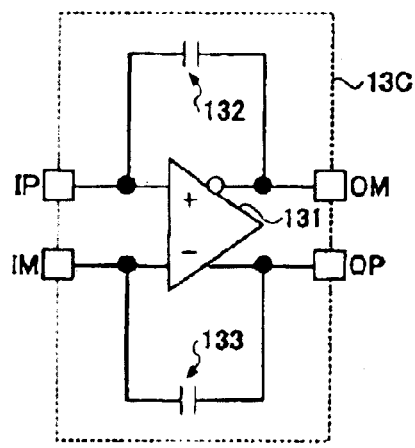
FIG. 14 is a diagram illustrating another embodiment of the amplifying circuit shown in FIG. 1.

FIG. 14 illustrates another embodiment of the amplifying circuit 13 of FIG. 1. The amplifying circuit 13C of FIG. 14 includes a differential amplifier 131 and capacitors 132, 133. Capacitors 132 and 133 set, like the capacitors 44 and 45 of the amplifying circuit 13 of FIG. 1, the gain of the differential amplifier 131 to the predetermined value depending on the rate for the capacitance connected on the input side of the differential amplifier 131.

In the above description, the switched capacitor circuit structure is preferably operated with a differential signal, but the switched capacitor circuit of the present invention may also be operated with single signal in place of the differential signal.

Figure 15:
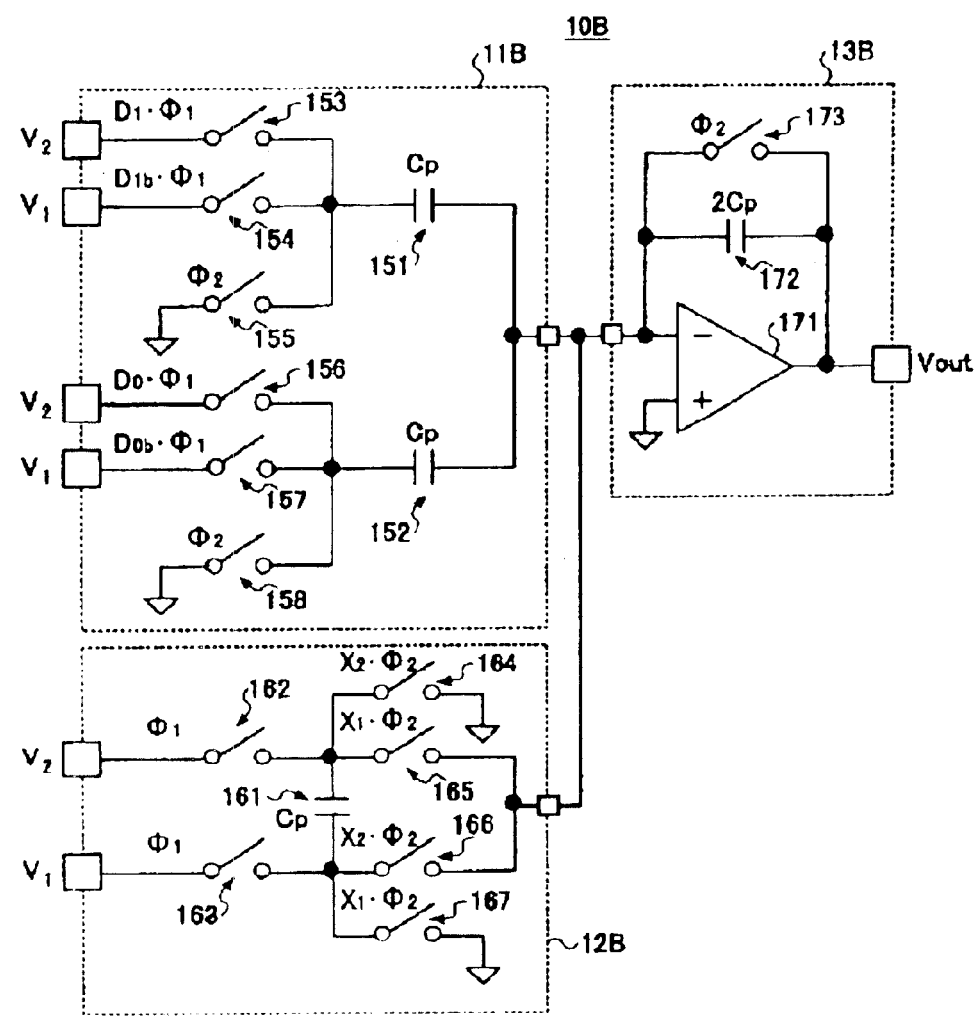
FIG. 15 is a diagram illustrating a structure of the switched capacitor circuit of a single signal of the present invention.

FIG. 15 illustrates an exemplary structure of the switched capacitor circuit operated with single signal of the present invention. The switched capacitor circuit 10B of FIG. 15 includes an interior division circuit 11B, an exterior division circuit 12B and an amplifying circuit 13B. The interior division circuit 11B includes capacitors 151 and 152 and switches 153 to 158. The switch 153 becomes conductive when $D_1 \cdot \phi1$ is "1", while switch 154 becomes conductive when $D_{1b} \cdot \phi1$ is "1". Here, the digital signals $D_1$ and $D_{1b}$ are in a complementary relationship. The switch 155 is preferably controlled with the timing signal $\phi2$ and becomes conductive in the second period. Therefore, the charge corresponding to $V_1$ or $V_2$ is accumulated in the capacitor 151 depending on the digital signal $D_1$ in the first period and this charge is connected to the input terminal of the amplifying circuit 13B in the second period.

Moreover, the capacitor 152 and switches 156 to 158 operate in a substantially similar manner. In one embodiment, the charge corresponding to V1 or V2 may be accumulated in the capacitor 152 depending on the digital signal Do and this charge is connected to the input terminal of the amplifying circuit 13B in the second period. Here, two capacitors 151 and 152 are used corresponding to the structure for interior division of the voltage between V1 and V2 into two voltages and two or more capacitors may also be used depending on the number of interior divisions.

In one embodiment, the exterior division circuit 12B includes the capacitor 161 and switches 162 to 167. The switches 162 and 163 may be controlled with the timing signal φ1 and is terminated in the first period. Therefore, a voltage equal to the difference between $V_1$ and $V_2$ is held in the capacitor 161. The digital signals $X_1$ and $X_2$ are signals to instruct that the exterior division signal at the external side of $V_1$ or the exterior division signal at the external side of $V_2$ is preferably obtained. When any one of these signals is "1", the other signal is "0". When $X_1$ is "1", the switches 165 and 167 become conductive and the other switches are opened in the second period, and the charge corresponding to $V_2-V_1$ is connected to the amplifying circuit 13B. When X2 is "1", the switches 164 and 166 become conductive and the other switches are opened in the second period and the charge corresponding to $V_1-V_2$ is connected to the amplifying circuit 13B.

In one embodiment, the amplifying circuit 13B includes a differential amplifier 171, a capacitor 172 and a switch 173. The switch 173 is preferably controlled with the timing signal φ2, and terminates the input and output of the differential amplifier to set them to the identical potential in the first period and is then opened in the second period. In this second period, the gain of the differential amplifier 171 is set to the desired value depending on the ratio of the capacitance of the capacitor 172 and capacitance connected to the input side of the differential amplifier 171. Here, the capacitance value of capacitor 172 is set to two times the capacitance value Cp used in the interior division circuit 11B and exterior division circuit 12B.

With the structure described above, the interior division voltage obtained by dividing the voltage between $V_1$ and $V_2$ into two voltages with the interior division circuit 11B is generated. Moreover, the exterior division circuit 12B generates $V_2-V_1$ or $V_1-V_2$ and this voltage is selectively added to the interior division voltage. Accordingly, the interior division voltages of $V_1$, $(V_1+V_2)/2$, and $V_2$ can be generated from the amplifying circuit 13B by setting X1 and X2 to "0". Moreover, it is also possible that $X_1$ is set to "1" and $V_2+(V_2-V_1)/2$ is outputted, for example, from the amplifying circuit 13B and $X_2$ is set to "1" and $V_1+(V_1-V_2)/2$, for example, is outputted from the amplifying circuit 13B.

Figure 16:
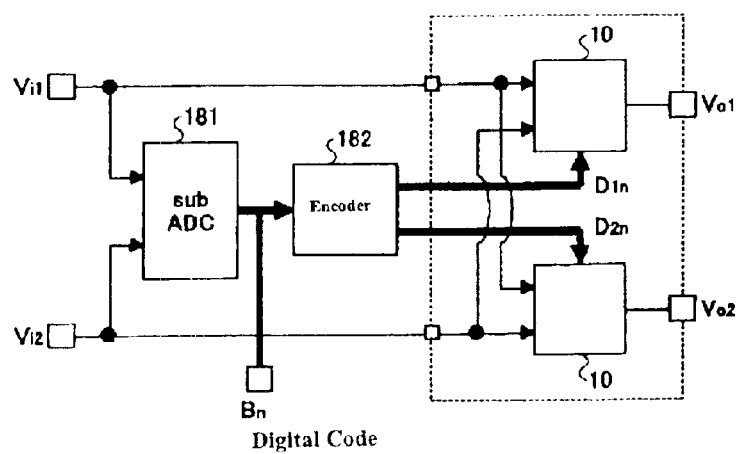
FIG. 16 is a diagram illustrating an embodiment of the structure of an A/D converter using the switched capacitor circuit of the present invention.

FIG. 16 illustrates an example of structure of an A/D converter using the switched capacitor circuit according to the present invention. The A/D converter of FIG. 16 includes a sub-A/D converter 181, an encoder 182 and two switched capacitor circuits 10. Inputs $V_{i1}$ and $V_{i2}$ are respectively formed from substantially differential signals. When a single signal is used in place of differential signal, it is preferable to use the switched capacitor circuit 10B shown in FIG. 15 in place of the switched capacitor circuit 10. The A/D converter of FIG. 16 corresponds to the circuit of only one stage to generate the partial bits among all bits of the output digital signal when the analog signal is converted to the digital signal. All bits of the output digital signal can be generated by connecting in series a plurality of circuits of FIG. 16.

The inputs Vi1 and Vi2 respectively have duration. The sub-A/D converter 181 outputs the boundary positions of both input signals as the binary code within the range between the upper limit of $V_{i1}$ and the lower limit of $V_{i2}$ by detecting a ratio of the width of input $V_{i1}$ and the width of input $V_{i2}$.

For example, the range between the upper limit Vi1 and the lower limit Vi2 is divided into four portions and each divided portion is assigned sequentially for the codes "00", "01", "10" and "11" from the lower side. When the detected boundary position is included in the range of the second divided portion, the sub-A/D converter 181 outputs the code "10". In this embodiment, this is outputted to the external side as the digital code output Bn.

Based on the digital code Bn, the encoder 182 generates digital signals $D_{in}$ and $D_{2n}$ and supplies these signals to each switched capacitor circuit 10. The switched capacitor circuit 10 in the upper side of the figure generates, based on the digital signal $D_{1n}$, the signal $V_{o1}$ having the width in the region larger than the boundary position within the range corresponding to the code "10" and also outputs this signal. Moreover, the switched capacitor circuit 10 in the lower side of the figure generates, based on the digital signal $D_{2n}$, the signal Vo2 having a width in the region less than the boundary position within the range corresponding to the code "10" and also outputs this signal. The signals Vo1 and Vo2 generated as described above are supplied to the A/D converter of the next stage and is subjected to the process of determining the value of lower bits.

The embodiments of the present invention have been described above but the present invention is not limited to the above embodiments and allows various changes or modifications within the scope of the claims thereof.

What is claimed is:

1. An integrated circuit for generating voltages not within a range between a first analog voltage and a second analog voltage, comprising:
   an interior division circuit to hold a first amount of charge corresponding to a weighted sum of the first analog voltage and the second analog voltage based on a digital signal;
   an exterior division circuit to hold a second amount of charge corresponding to a difference between the first analog voltage and the second analog voltage; and
   an amplifying circuit to generate a voltage corresponding to the sum of the first and second amount of charges.

2. The integrated circuit according to claim 1, wherein the first analog voltage is a first differential signal of a first non-inverted voltage and a first inverted voltage and the second analog voltage are a second differential signal of a second non-inverted voltage and a second inverted voltage.

3. The integrated circuit according to claim 1, wherein the amplifying circuit includes a non-inverted input and an inverted input, wherein the non-inverted input is supplied with a first charge corresponding to the sum of the non-inverted voltage of the first analog voltage and the inverted voltage of the second analog voltage, and wherein the inverted input is supplied with a second charge corresponding to the sum of the inverted voltage of the first analog voltage and non-inverted voltage of the second analog voltage.

4. The integrated circuit according to claim 1, further comprising a selector circuit connected between the exterior division circuit and the amplifying circuit for supplying a charge held by the exterior division circuit or a inverted charge which inverts the charge to the amplifying circuit.

5. The integrated circuit according to claim 4, wherein the selector circuit further does not supply the charge held by the exterior division circuit to the amplifying circuit.

6. The integrated circuit according to claim 1, wherein the amplifying circuit includes an amplifier and at least one capacitance element for connecting the input and output of the amplifier.

7. The integrated circuit according to claim 1, wherein the amplifying circuit includes an amplifier and at least one switch element for connecting the input and output of the amplifier.

8. The integrated circuit according to claim 1, wherein the interior division circuit comprises a plurality of capacitance elements and a plurality of switch elements.

9. The integrated circuit according to claim 8, wherein the plurality of capacitance elements are connected to any one of the first analog voltage and the second analog voltage based on the digital signal.

10. The integrated circuit according to claim 9, wherein the plurality of capacitance elements store the charge in the first period and output a potential corresponding to the charge of the capacitance elements in the second period.

11. The integrated circuit according to claim 1, wherein the exterior division circuit includes at least one capacitance element and a plurality of switches.

12. The integrated circuit according to claim 11, wherein the at least one capacitance element accumulates a charge corresponding to the difference of the first analog voltage and the second analog voltage in the first period and outputs a potential corresponding to the charge of the at least one capacitance element in the second period.

13. The integrated circuit according to claim 1, wherein a plurality of exterior division circuits are provided.

14. The integrated circuit according to claim 13, wherein at least one of the plurality of exterior division circuits is driven by a control signal.

15. The integrated circuit according to claim 1, wherein a voltage without the range from the first analog voltage to the second analog voltage is generated.

16. An A/D converting circuit, comprising:
an interior division circuit to hold a first amount of charge corresponding to a weighted sum of the first analog voltage and second analog voltage based on a digital signal;
an exterior division circuit to hold a second amount of charge corresponding to a difference between the first analog voltage and the second analog voltage; and
an amplifying circuit to generate a voltage corresponding to the sum of the first and second amount of charges.

17. An A/D converting circuit, comprising:
a first circuit; and
a second circuit;
wherein the first circuit comprises:
a first interior division circuit to hold a first amount of charge corresponding to a weighted sum of the first analog voltage and second analog voltage based on a digital signal;
a first exterior division circuit to hold a second amount of charge corresponding to a difference between the first analog voltage and the second analog voltage; and
a first amplifying circuit to generate a voltage corresponding to the sum of the first and second amount of charges;
wherein the second circuit comprises:
a second interior division circuit to hold a first amount of charge corresponding to a weighted sum of the first analog voltage and second analog voltage based on a digital signal;
a second exterior division circuit to hold a second amount of charge corresponding to a difference between the first analog voltage and the second analog voltage; and
a second amplifying circuit to generate a voltage corresponding to the sum of the first and second amount of charges.

18. The A/D converting circuit according to claim 17, wherein a voltage without the range from the first analog voltage to the second analog voltage is generated.

19. The A/D converting circuit according to claim 17, wherein the amplifying circuit includes an amplifier, at least one switch element for connecting the input and output of the amplifier, and at least one capacitance element inserted between the input and output of the amplifier.

* * * * *